US007405871B2

(12) United States Patent
Sasian

(10) Patent No.: US 7,405,871 B2
(45) Date of Patent: Jul. 29, 2008

(54) EFFICIENT EUV COLLECTOR DESIGNS

(75) Inventor: Jose Sasian, Tucson, AZ (US)

(73) Assignee: Intel Corporation, Santa Clara, CA (US)

( * ) Notice: Subject to any disclaimer, the term of this patent is extended or adjusted under 35 U.S.C. 154(b) by 128 days.

(21) Appl. No.: 11/054,040

(22) Filed: Feb. 8, 2005

(65) Prior Publication Data

US 2006/0176547 A1 Aug. 10, 2006

(51) Int. Cl.
*G02B 5/08* (2006.01)
(52) U.S. Cl. .................. 359/351; 359/350; 359/858; 359/857; 355/67; 378/34; 313/114
(58) Field of Classification Search .................. None
See application file for complete search history.

(56) References Cited

U.S. PATENT DOCUMENTS

| | | | |
|---|---|---|---|
| 5,361,292 A | 11/1994 | Sweatt | |
| 5,737,137 A | 4/1998 | Cohen et al. | |
| 6,118,577 A * | 9/2000 | Sweatt et al. | 359/351 |
| 6,186,632 B1 * | 2/2001 | Chapman et al. | 359/857 |
| 6,195,201 B1 | 2/2001 | Koch et al. | |
| 6,210,865 B1 | 4/2001 | Sweatt et al. | |
| 6,285,737 B1 | 9/2001 | Sweatt et al. | |
| 6,398,374 B1 | 6/2002 | Chapman et al. | |
| 6,400,794 B1 | 6/2002 | Schultz et al. | |
| 6,410,928 B1 | 6/2002 | Verhoeven et al. | |
| 6,438,199 B1 | 8/2002 | Schultz et al. | |
| 6,573,978 B1 | 6/2003 | McGuire, Jr. | |
| 6,594,334 B1 | 7/2003 | Ota | |
| 6,841,322 B1 | 1/2005 | Lee | |
| 6,968,850 B2 | 11/2005 | Chan et al. | |
| 6,982,133 B2 | 1/2006 | Chandhok et al. | |
| 7,078,700 B2 | 7/2006 | Chandhok et al. | |
| 7,230,258 B2 | 6/2007 | Ruzic et al. | |

(Continued)

FOREIGN PATENT DOCUMENTS

EP 1202101 5/2002

(Continued)

OTHER PUBLICATIONS

Elmer, W. , "The Optical Design of Reflectors", *TLA Lighting Consultants*, (1989),37-53 & 226-248.

(Continued)

*Primary Examiner*—Arnel C Lavarias
(74) *Attorney, Agent, or Firm*—Blakely, Sokoloff, Taylor & Zafman LLP

(57) ABSTRACT

A collector that includes a laser produced plasma (LPP) extreme ultra violet (EUV) light source and a first optical path from the source to a mirror. The mirror is the first mirror that light emitted from the source and traveling along the first optical path impinges upon. The collector also includes a second optical path from the source to another mirror. The other mirror is the first mirror that light emitted from the source and raveling along the second path impinges upon. The mirror and the other mirror are oriented relative to the source such that light from the source traveling along the first optical path travels in a direction opposite to light traveling from the source along the second optical path. A collector having a discharge extreme ultra violet (EUV) light source.

17 Claims, 11 Drawing Sheets

U.S. PATENT DOCUMENTS

| | | |
|---|---|---|
| 2002/0054660 A1 | 5/2002 | Komatsuda et al. |
| 2002/0191170 A1 | 12/2002 | Komatsuda |
| 2003/0012333 A1 | 1/2003 | Schultz et al. |
| 2003/0043455 A1 | 3/2003 | Singer et al. |
| 2003/0076607 A1 | 4/2003 | Antoni et al. |
| 2003/0095623 A1 | 5/2003 | Singer et al. |
| 2003/0142283 A1 | 7/2003 | McGuire, Jr. |
| 2004/0017885 A1 | 1/2004 | Antoni et al. |
| 2004/0183031 A1 | 9/2004 | Silverman et al. |
| 2006/0131515 A1* | 6/2006 | Partlo et al. ............. 250/504 R |

FOREIGN PATENT DOCUMENTS

| | | |
|---|---|---|
| EP | 1333325 | 8/2003 |
| WO | WO 03/075068 A1 | 9/2003 |
| WO | WO-03098348 | 11/2003 |

OTHER PUBLICATIONS

Welford, W.T., and Winston, R., "High Collection Nonimaging Optics", *Chapers 4 and 5, Academic Press, Inc.*, (1989), pp. 53-97.

* cited by examiner

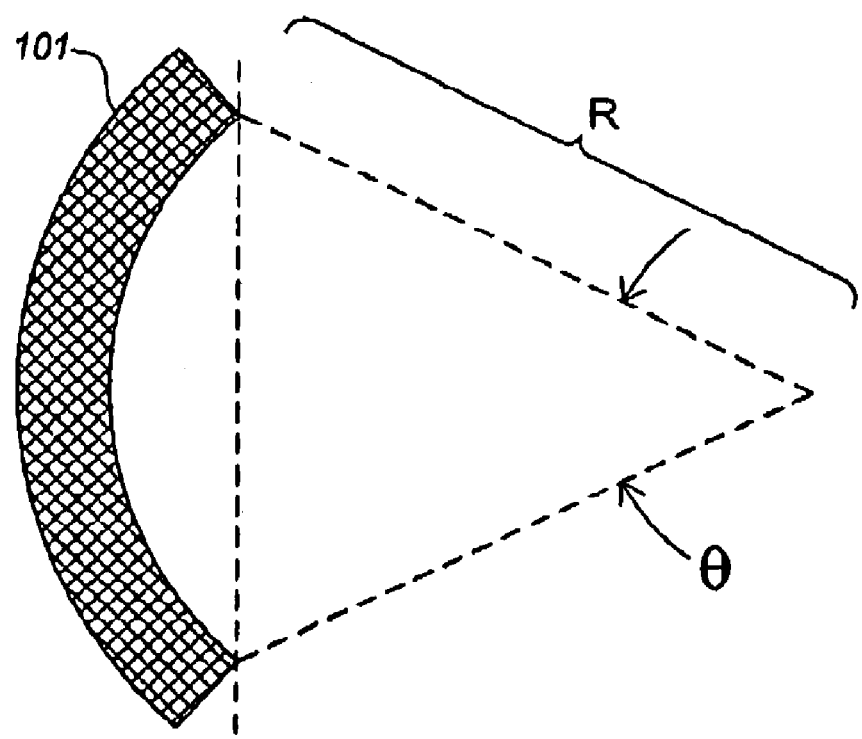
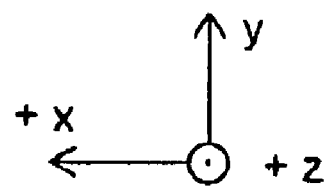
FIG. 1
PRIOR ART

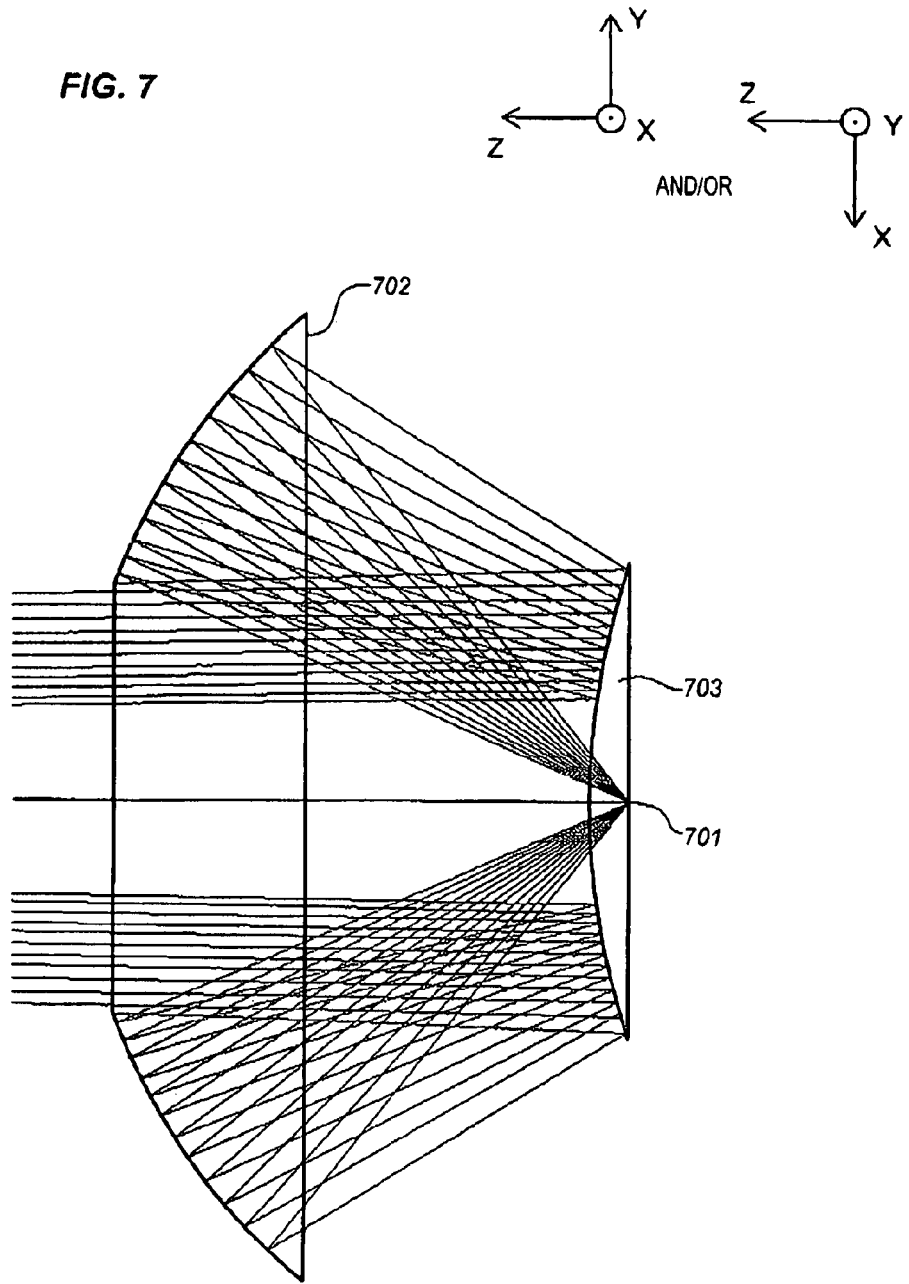

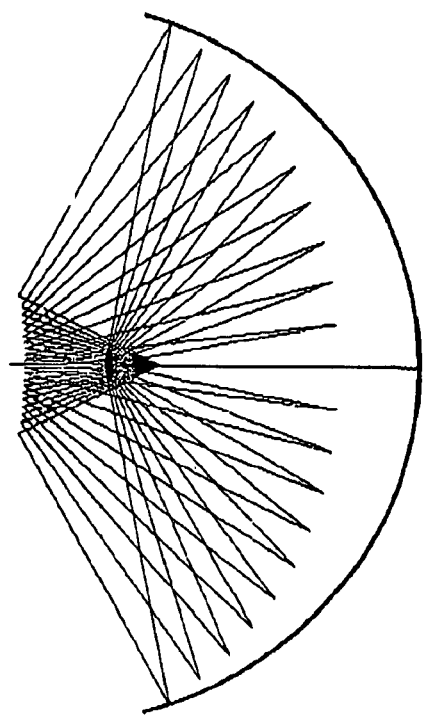
FIG. 9
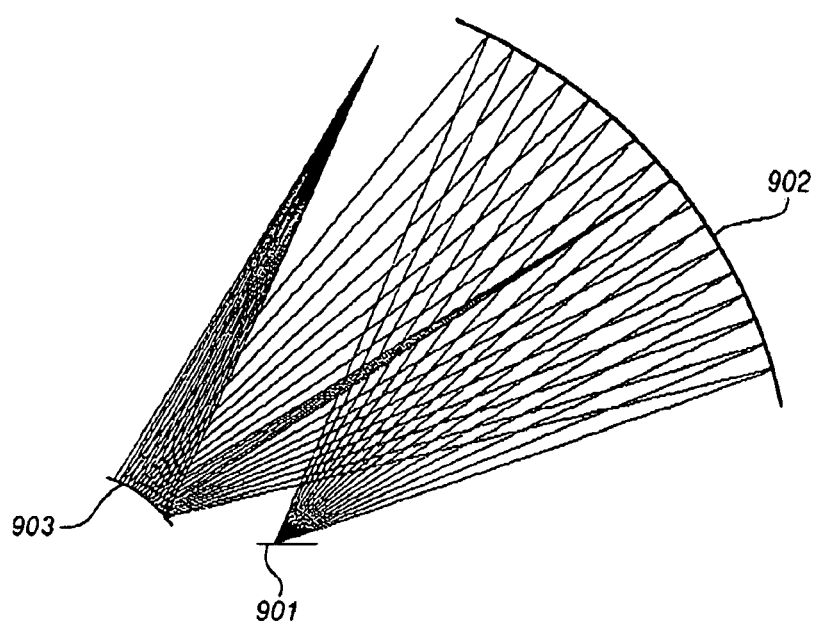

EFFICIENT EUV COLLECTOR DESIGNS

BACKGROUND

In the field of electronics, conductive and/or insulating features are formed on a substrate through photo-lithographic techniques. Essentially, an optical image that represents one or more patterns to be formed onto the substrate is directed onto a layer of photo resist that has been coated onto the substrate. A projection camera projects the optical image onto the photo resist layer from light that has been patterned in accordance with a mask.

In general, a primary measure of an electronic device's sophistication is its smallest feature size. The smallest feature size of an electronic device is largely determined by the sophistication of the lithography techniques and/or equipment employed in the device's manufacture. In particular, the shorter the wavelength of the light that is processed by the photo-lithographic equipment's projection camera optics, the smaller the smallest achievable feature size becomes.

Thus, in general, the smaller the wavelength of the light that is processed by the projection camera's optics, the more sophisticated the projection camera is deemed to be. Presently, considerable work is being done in the development of photo-lithographic equipment that processes light in the Extreme Ultra Violet (EUV) spectra (a range approximately from 10 to 14 nm). Part of the challenge in designing EUV photo-lithographic equipment is designing that portion of the equipment that "pre-conditions" the EUV light prior to illuminating the mask and the entrance pupil of the projection camera.

FIG. 1 shows a simplistic depiction of the cross section of the "shape" of light as it is reflected from the mask at a "ring field" projection camera. According to the depiction of FIG. 1, the light travels substantially along the z axis through arc 101. According to one EUV approach, the arc 101 of the EUV light has a radius R between 116 mm and 124 mm over an angle θ of approximately 30°. Moreover, at least for EUV light, the illumination of the light over the arc 101 is supposed to be highly uniform (e.g., on the order of only 1% variation across the arc 101).

A condenser is used to form light into the appropriate shape and uniformity at the projection camera entry pupil. The condenser can usually be viewed as containing two components: 1) a collector; and, 2) an illumination system. The collector is designed to collect photons from a light source. The illumination system crafts the light from the collector into the appropriate shape for illuminating the mask (arc field) and illuminating the entrance pupil of the projection camera.

An exemplary condenser originally described in U.S. Pat. No. 6,195,201 B1 (hereinafter, "Koch et. al.") is shown in FIG. 2. The collector 201 includes a light source 203 and a collection mirror 204. The collection mirror 204 directs the light it collects into the illumination system 202. The illumination system 202 includes a pair of faceted mirrors 205, 206. The faceted mirrors 205, 206 effectively break down the light from the collector 201 into a plurality of beams that are recombined by relaying mirrors 207, 208 so as to form light of the proper shape and uniformity at the mask plane 209 of the projection camera.

A problem with EUV condensers is their expense. The cost of an EUV condenser is largely a function of the amount of photon energy that its light source emits. That is, the more photon energy that a light source emits, the more expensive the condenser.

DRAWINGS

The present invention is illustrated by way of example, and not limitation, in the figures of the accompanying drawings in which like references indicate similar elements and in which:

FIG. 1 shows EUV light shaped to enter a mask plane of a projection camera;

FIG. 7 shows a first embodiment of a collector for a discharge source;

FIG. 9 shows a third embodiment of a collector for a discharge source; and,

DETAILED DESCRIPTION

In order to reduce the cost of an EUV condenser, more efficient collectors should be designed. By designing collectors that are capable of directing more photon energy from the light source into the illumination system, the amount of light energy needed from the source can be reduced; which, in turn, should lower the cost of the condenser as a whole because less expensive EUV sources can be used.

Figure 3:
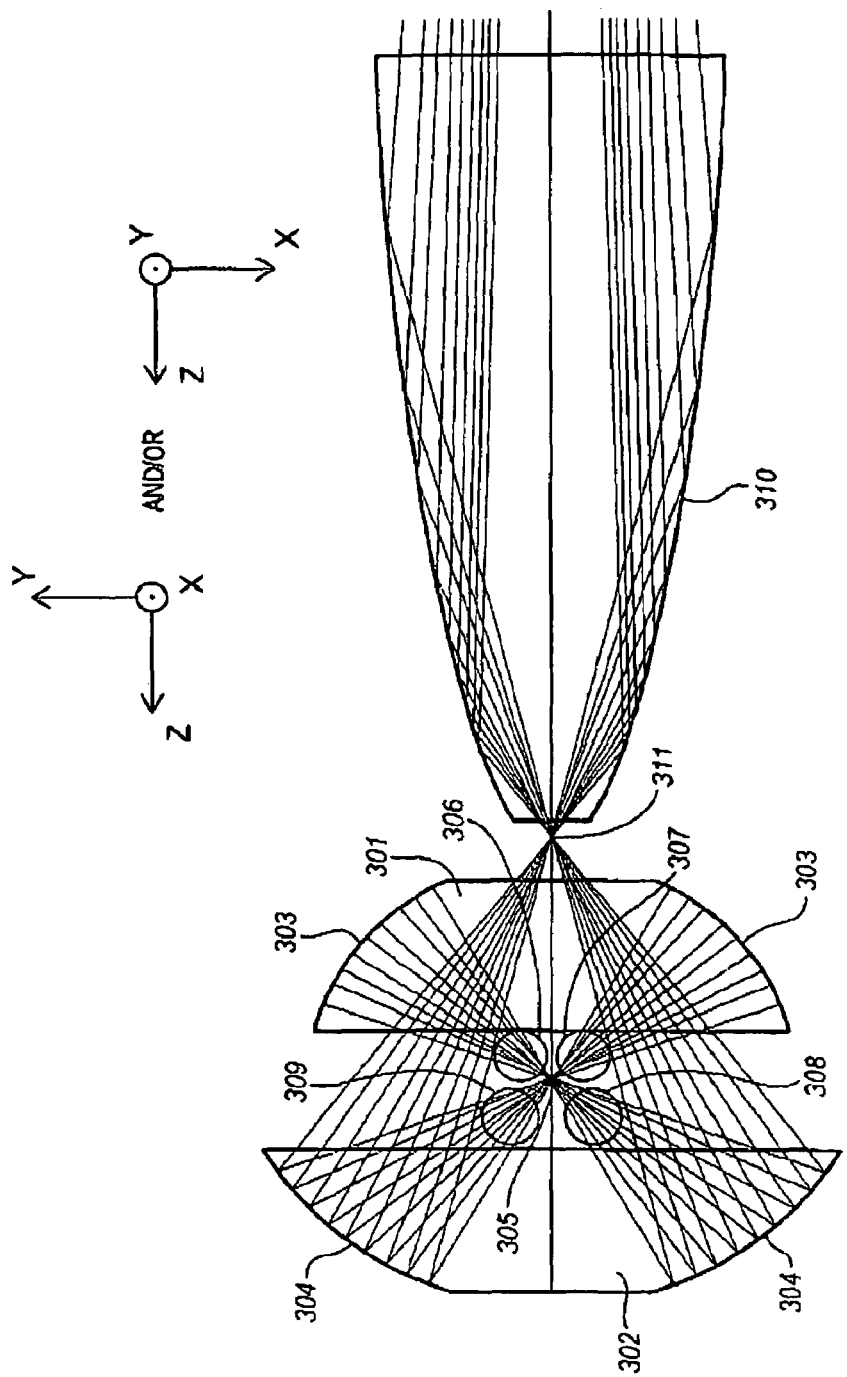
FIG. 3 shows a first embodiment of a collector for an LPP EUV source.

Two types of EUV light sources that are presently in common use are Laser Produced Plasma (LPP) sources and discharge sources. FIGS. 3 though 6 show designs for efficient EUV collectors that include an LPP source; and, FIGS. 7 through 9 show designs for efficient EUV collectors that include a discharge source. A discussion of these designs immediately follows.

Collector with LPP EUV Source

FIGS. 3 through 6 show designs for efficient EUV collectors that include an LPP source. According to the designs of FIGS. 3 through 6, efficiency is improved over prior art LPP sourced EUV collectors through then collection of light over, approximately, a sphere that surrounds the LPP source. Prior art LPP sourced EUV collectors (such as the source 203 of Koch et al. shown in FIG. 2) are believed to only collect light over, approximately, no more than a hemisphere resulting in less collected photon energy than the designs observed in FIGS. 3 through 6.

Another feature of the collector designs of FIGS. 3 through 6 that prior art LPP sourced EUV collectors are not known to exhibit is that they each collect light from the source that travels from the source in opposite directions. Both the spherical nature of the collection range and the collection of light traveling from the source in opposite directions is apparent from an analysis of each of the drawings observed in FIGS. 3 through 6.

Figure 4:
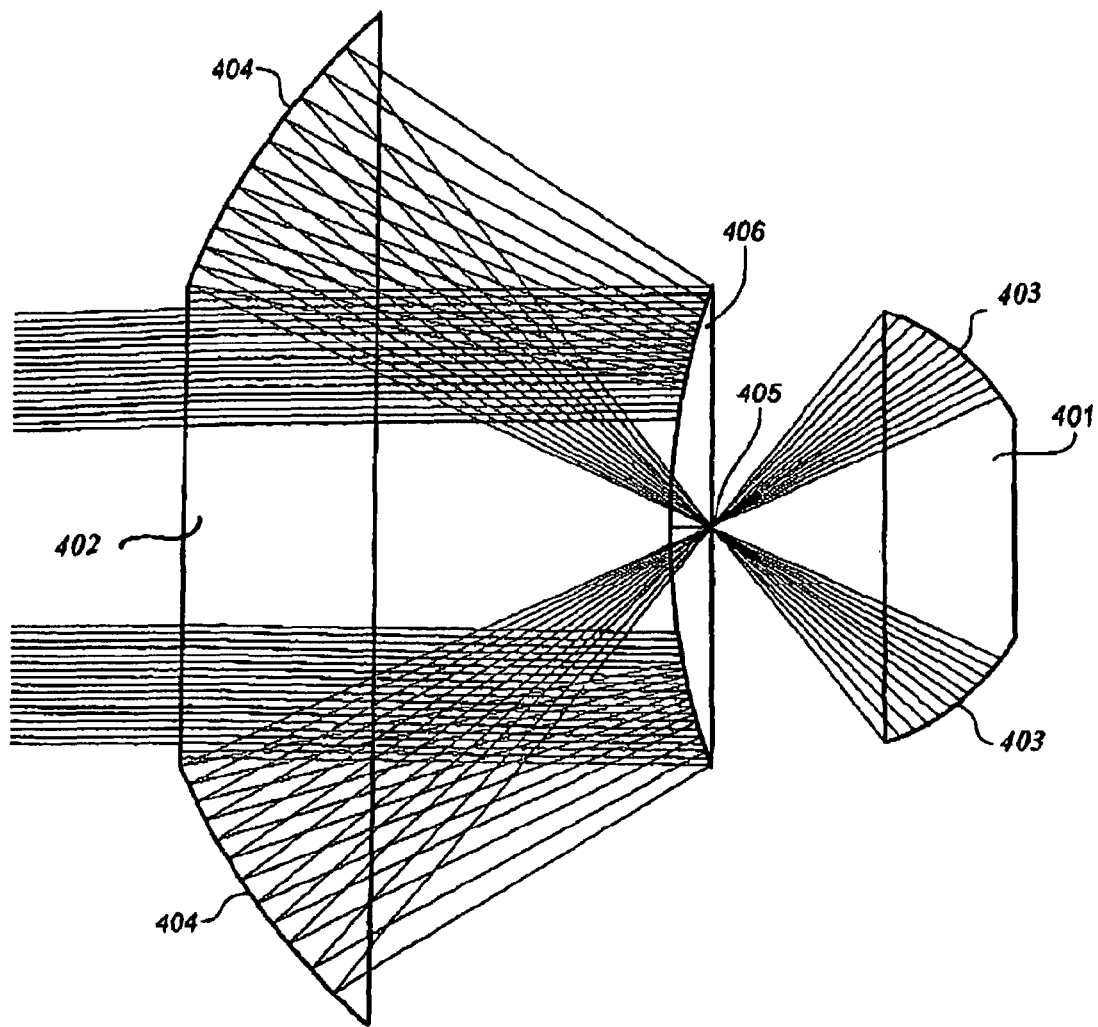
FIG. 4 shows a second embodiment of a collector for an LPP EUV source.

Specifically, note that each of the collector designs of FIGS. 3 and 4 have two mirror stages whose reflecting surfaces face one another. That is, for example the collector design of FIG. 3 has a first mirror 301 whose reflective surface 303 faces the reflective surface 304 of a second mirror 302. Similarly, the collector design of FIG. 4 has a first mirror 401 whose reflective surface 403 faces the reflective surface 404 of a second mirror 402. Each of the mirror pairs 301, 302 and 401, 402 represent the first highly reflective surface that light from the LPP EUV source 305, 405 impinges upon.

Referring to FIG. 3, light from the source 305 is drawn radiating in four different arcs 306, 307, 308, 309. Note that, in demonstrating the approximately spherical collection range of the collector, arcs 306 and 308 correspond to oppositely traveling light from the LPP source 305 and arcs 307 and 309 correspond to oppositely traveling light from the LPP source 305. Also, again demonstrating the spherical collection range of the collector, the pair of applicable coordinate axis shown in FIG. 3 indicate that the design is symmetrical about the z axis.

According to the design of FIG. 3, light propagates from the source 305 and reflects off of mirrors 301 and 302. Light that reflects off of mirror 302 reflects into grazing incidence mirror 310. Light that reflects off of mirror 301 reflects back onto and off of mirror 302 and then into grazing incidence mirror 310. From grazing mirror 310 the collected light is directed toward the illumination system of the condenser.

The near grazing incidence angle of light (e.g., less than or equal to as 15° when measured against the reflective surface of the mirror 310) as it passes into grazing mirror 310 permits a high collection angle for each of mirrors 301 and 302 (e.g., in a range of 75° to 90°). The grazing incidence mirror 310 also conditions the illumination beam for the downstream mirrors of the illumination system. Also, related embodiments may only collect over approximately a hemisphere rather than a sphere (e.g., just mirror 302 is employed and not mirror 301).

In an embodiment, in order to ensure efficient reflectivity off of mirrors 301, 302, the angle of incidence at each of mirrors 301, 302 for non reflected light emanating from the source 305 is "normal" or "near normal" (e.g., less than or equal to 15° when measured against a ray that is normal to the reflecting surface of the mirror) across most, if not all, of the surface area of mirrors 301, 302). Graded reflective coatings on the mirror surfaces may permit more severe angles of incidence.

In an embodiment, the reflecting surface 303 of mirror 301 is approximately elliptical and the reflecting surface 304 of mirror 302 is approximately spherical. Mirror 302 may also be larger than mirror 301. In other or same embodiments, the collection angle for both mirrors 301, 302 ranges from 25° to 90°. Each of mirrors 301 and 302 may be annular to make room for the source 305 and any other fixtures. In the alternative, the surfaces may be biconic as used in lens optimization software design tools with the purpose of elongating the source image.

The optical design of FIG. 4 is similar to that of FIG. 3, except that a third mirror 406 is inserted between mirrors 401, 402 so as to eliminate the grazing incidence mirror 310. That is, light propagates from the source 405 and reflects off of mirrors 401 and 402. Light that reflects off of mirror 402 reflects off of mirror 406. Light that reflects off of mirror 401 reflects back onto and off of mirror 402 and then off of mirror 406. From mirror 406 the collected light is directed toward the illumination system of the condenser.

Again, in an embodiment, in order to ensure efficient reflectivity off of mirrors 401, 402, the angle of incidence at each of mirrors 401, 402 for non reflected light emanating from the source 405 is "normal" or "near normal" (e.g., less than or equal to 15° when measured against a ray that is normal to the reflecting surface of the mirror) across most, if not all, of the surface area of mirrors 401, 402. Also, again, graded reflective coatings on the mirror surfaces may permit more severe angles of incidence.

In an embodiment, the reflecting surface of mirror 401 is approximately elliptical and the reflecting surface of mirror 402 is approximately spherical. Mirror 402 may also be larger than mirror 401. In other or same embodiments, the collection angle for both mirrors 401, 402 ranges from 45° to 85°. Each of mirrors 401 and 402 may be annular to make room for the source 405 and any other fixtures.

Figure 5:
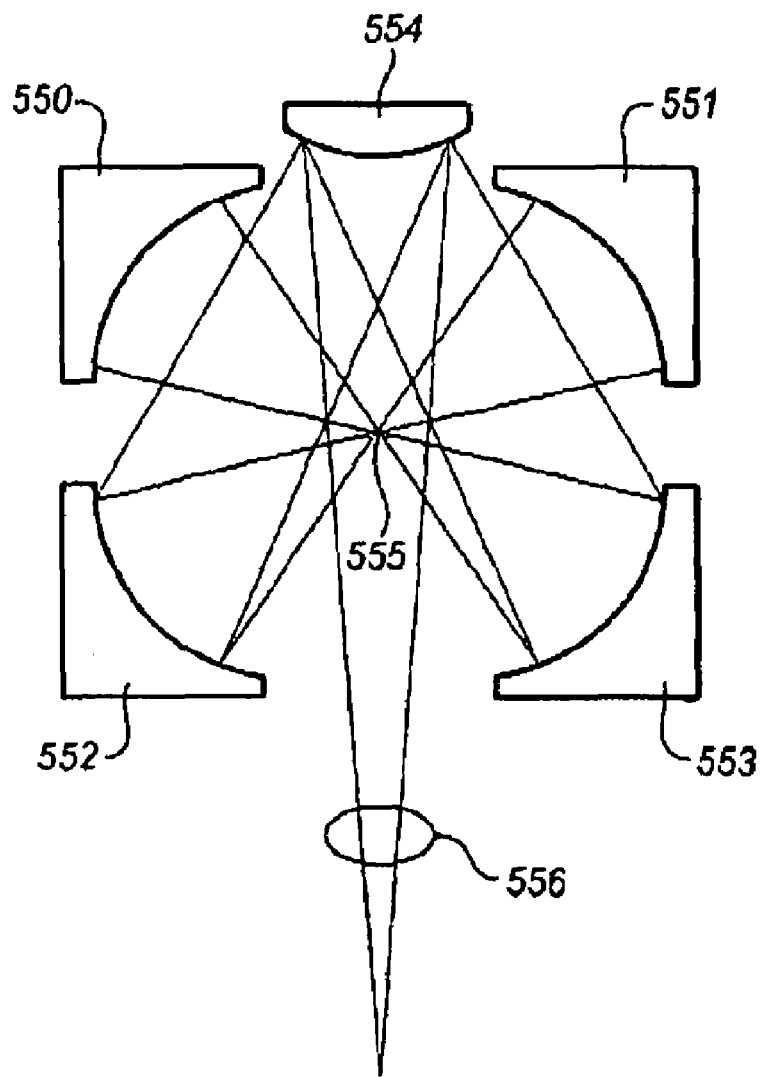
FIG. 5 shows a third embodiment of a collector for an LPP EUV source.

FIG. 5 shows another collector embodiment for an LPP EUV source. Like the designs of FIGS. 3 and 4, the collector design of FIG. 5 is capable of an approximately spherical collection range. Here, light traveling from the source will impinge upon each of reflecting elements (e.g., mirrors) 550, 551, 552 and 553. Reflecting element 554 receives light from each of reflecting elements 552 and 553. Reflecting element 552 receives light from reflecting element 551 and reflecting element 553 receives light from reflecting element 550. Reflecting element 554 forms output light 556. Reflecting elements 550, 551, 552 and 553 can be elliptical or nearly elliptical, spherical or nearly spherical, conical or nearly conical or biconical or nearly biconical.

Figure 6:
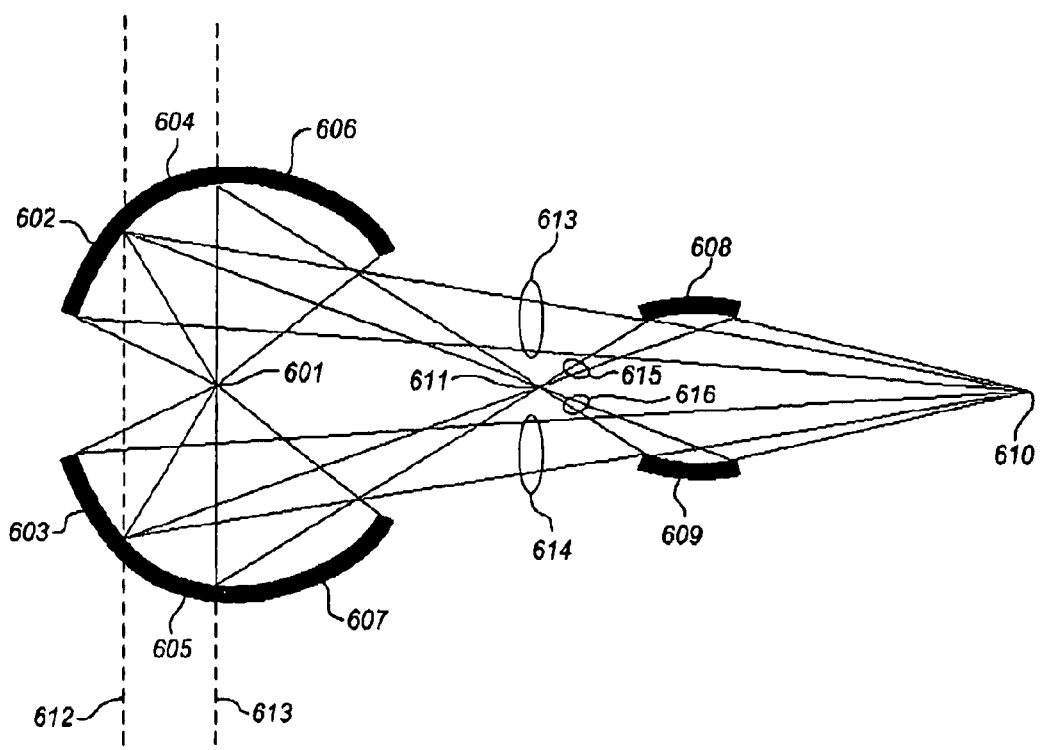
FIG. 6 shows a fourth embodiment of a collector for an LPP EUV source.

FIG. 6 shows another collector embodiment for an LPP EUV source. Again, the collector design of FIG. 6 can collect light over an approximately spherical (rather than hemispherical) collection range. The light paths associated with the collector of FIG. 6 are most easily understood in reference to axis 612 and 613. Specifically, axis 612 and 613 can together be viewed as: 1) breaking down a first reflecting element into regions 602, 604 and 606; and 2) breaking down a second reflecting element into regions 603, 605, 607.

Light that impinges upon regions 602 and 603 directly from source 601 form reflected beams 613 and 614, respectively. These beams focus to focus point 610. Light that impinges upon regions 604 and 605 directly from source 601 form reflected beams that pass through focus point 611 and continue forward to form reflected beams 615 and 616. Reflected beam 615 impinges upon reflecting surface 608 and converges after its reflection at focal point 610. Similarly, reflected beam 616 impinges upon reflecting surface 609 and converges after its reflection at focal point 610.

Note also a degree of stability against movement of the source 601 is likely to result from the perspective of image 610 because a number of light beams that experience an odd number of reflections in reaching source 610 will be compensated for by a number of light beams that experience an even number of reflections in reaching source 610.

Light that impinges upon region 606 directly from the source 601 reflects back to regions 603 and 605. The light that reflects to region 603 behaves as described above for region 603, and, the light that reflects to region 605 behaves as described above for region 605. Similarly, light that impinges upon region 607 directly from the source 601 reflects back to regions 602 and 604. The light that reflects to region 602 behaves as described above for region 602, and, the light that reflects to region 604 behaves as described above for region 604. Note that the diagram in FIG. 6 is a cross section of the overall collector. Here, it is expected that the embodiments may be constructed where this cross section is preserved over a plurality if not all angles of view.

According to at least one implementation, regions 602 and 603 are part of the same annular reflective component. In combination, regions 604 and 605 may also be formed from a same, second annular reflective component that is coupled next to the annular component that forms regions 602 and 603. Alternatively, regions 604 and 605 may be formed with different reflective components with respect to one another; and/or, may be formed from the same reflective component that forms regions 602 and 603 (either as a whole or respectively). Regions 606 and 607 may be part of the same reflective component that regions 604 and 605 are formed with (either as a whole or respectively); or, may be formed with different components from those that form regions 604 and 605. Regions 606 and 607 may also be formed from the same annular reflective component or may be separate with respect to one another.

Collector with Discharge EUV Source

Known prior art collectors that collect EUV energy from a discharge source collect the EUV light at high "grazing" angles of incidence. Grazing angles of incidence can have poor collection efficiency given that they only collect at a collection angle no more than 45°. As such, in order to enhance the efficiency of a discharge source collector, a "normal" or "near-normal" angle of incidence is used at the collector's reflective surfaces. FIGS. 7 through 9 show designs for efficient EUV collectors that include a discharge source. A discussion of each immediately follows.

The design of FIG. 7 is similar to that of FIG. 4 except that mirror 401 is removed. Here, discharge EUV sources generally emit more light energy than LPP sources. As such, the collection optics need not approximately surround the source as was discussed with respect to the collector designs of FIGS. 3 through 6. Moreover, discharge sources tend to be larger in size than LPP sources; and, as a consequence, surrounding the source with collection optics may not be practicable.

According to the design of FIG. 7, light from a discharge source 701 is reflected at near normal incidence (e.g. at or less than 15° when measured against a ray that is normal to the reflecting surface of mirror 702) off of mirror 702 onto mirror 703; which, in turn, reflects the light toward the illumination system of the condenser. In an embodiment, the collection angle of mirror 702 ranges from 45° to 85°. Also, as depicted by the coordinate axis, the collector is symmetrical about the z axis. Mirrors 702 and 703 may be annular to make room for the source 701 and any other fixtures.

Figure 8A:
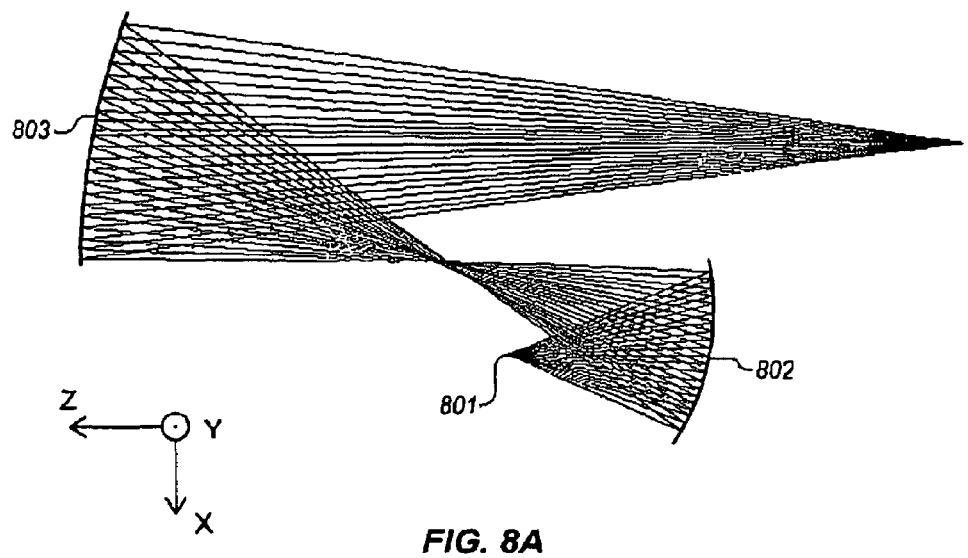
FIGS. 8a, 8b show a second embodiment of a collector for a discharge source.
Figure 8B:
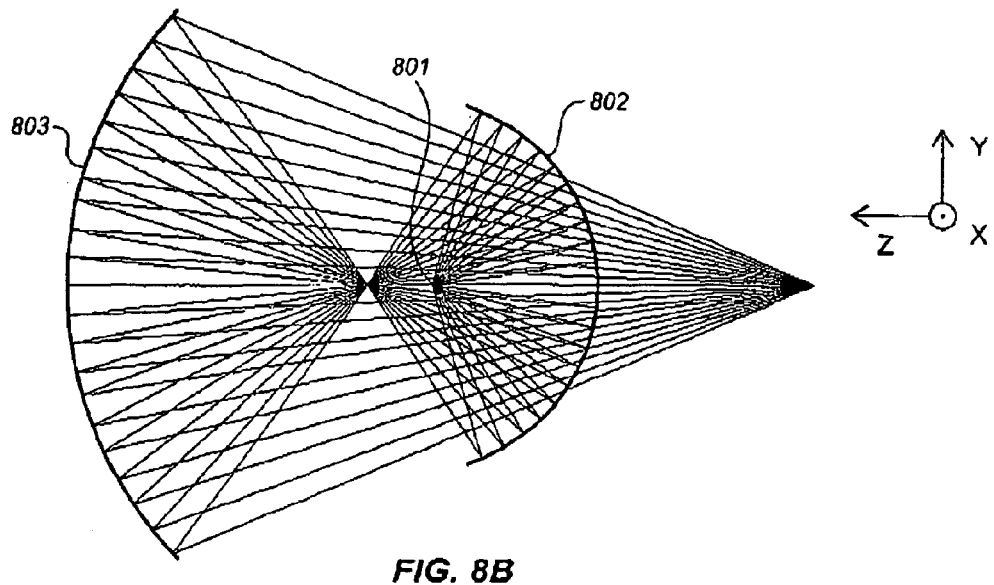

FIG. 8a shows a top view and FIG. 8b shows a side view of another collector design for a discharge source. According to the design of FIGS. 8a and 8b, light from discharge source 801 is reflected at near normal incidence (e.g. at or less than 150 when measured against a ray that is normal to the reflecting surface of mirror 802) off of a first mirror 802 toward a second mirror 803 from which it is reflected at near normal incidence toward the illumination system. Referring to the top view depiction in FIG. 8a, the first mirror 802 is tilted so as to direct its reflected light past the source 801 on its way toward mirror 803 without being obscured by the source 801 (i.e., the source is not in its way).

Here, because the side view of FIG. 8b shows a continuous collection angle from about +75° to –75°, reflected light from mirror 802 needs to be directed off the side of the source 801 (as shown in FIG. 8a) in order to be directed past the source 801. Moreover, because of the continuous collection angles through their middle, mirrors 802 and 803 may be non annular (i.e., there does not exist a need to make room for the source 801 or other fixtures through the middle of the mirrors 802, 803).

The approach of FIGS. 8a and 8b show the first mirror 802 being smaller than the second mirror 803. FIG. 9 shows a top view of an alternative design to that of FIGS. 8a and 8b where the first mirror 902 is larger than the second mirror 903. Here, FIG. 9 can be directly compared against FIG. 8a. Again, mirrors 902, 903 have a continuous collection angle through their middle. As such, reflected light from mirror 902 needs to be directed off the side of the source 901 in order to be directed past the source 901. Moreover, because of their continuous collection angles, mirrors 902, 903 may be non annular.

In both the designs of FIGS. 8a,b and 9, light is directed past the source 801, 901 by the first mirror 802, 902 to allow for a wider total collection angle at the first mirror 802, 702.

Faceted Collector Mirrors

Figure 10:
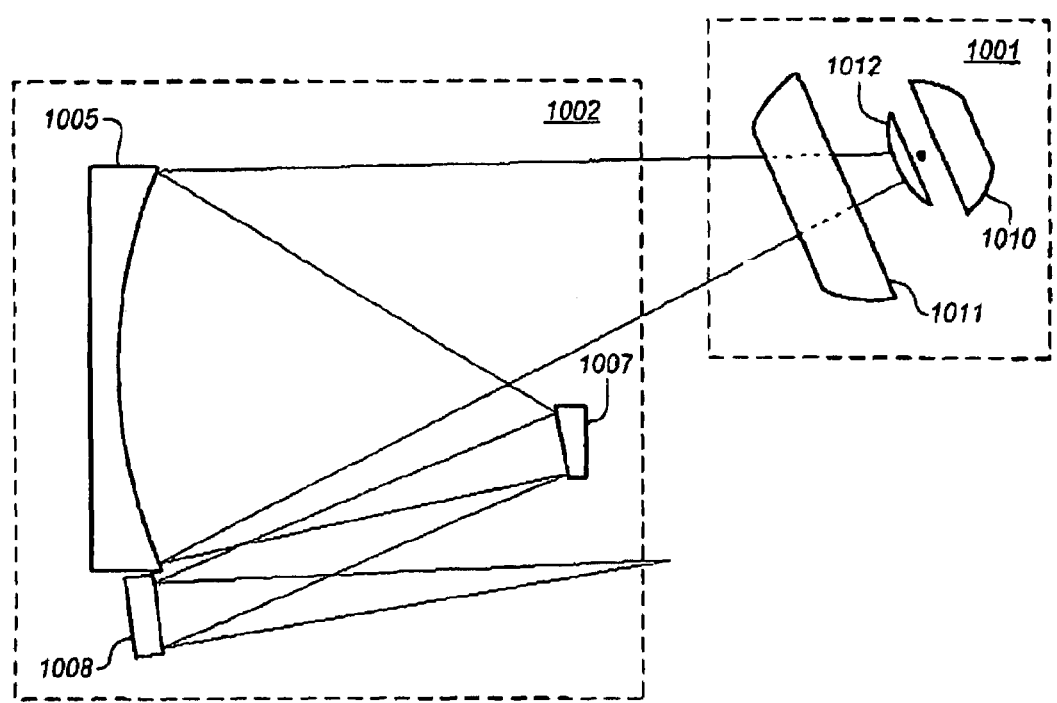
FIG. 10 shows that a faceted collector mirror can eliminate a mirror in an illumination system.

Koch et al. (discussed in the background) reveals that a faceted mirror can be used in the collector. The reflective surface of a faceted mirror is made of smaller discrete reflective surfaces that are positioned to break an incident beam into a plurality of smaller beams. FIG. 10 shows a faceted mirror having arc shaped discrete surfaces. In alternate approaches the discrete surfaces may be square, hexagonal or some other tilted surface.

Presently, it has been realized that the use of faceted mirrors in the collector can be used to reduce the number of optical components in the illumination system; and, moreover, the use of faceted mirrors can be used to compensate for variations in the source's illumination properties. FIG. 10 demonstrates the former and further discussion of FIG. 3 demonstrates the later.

Figure 2:
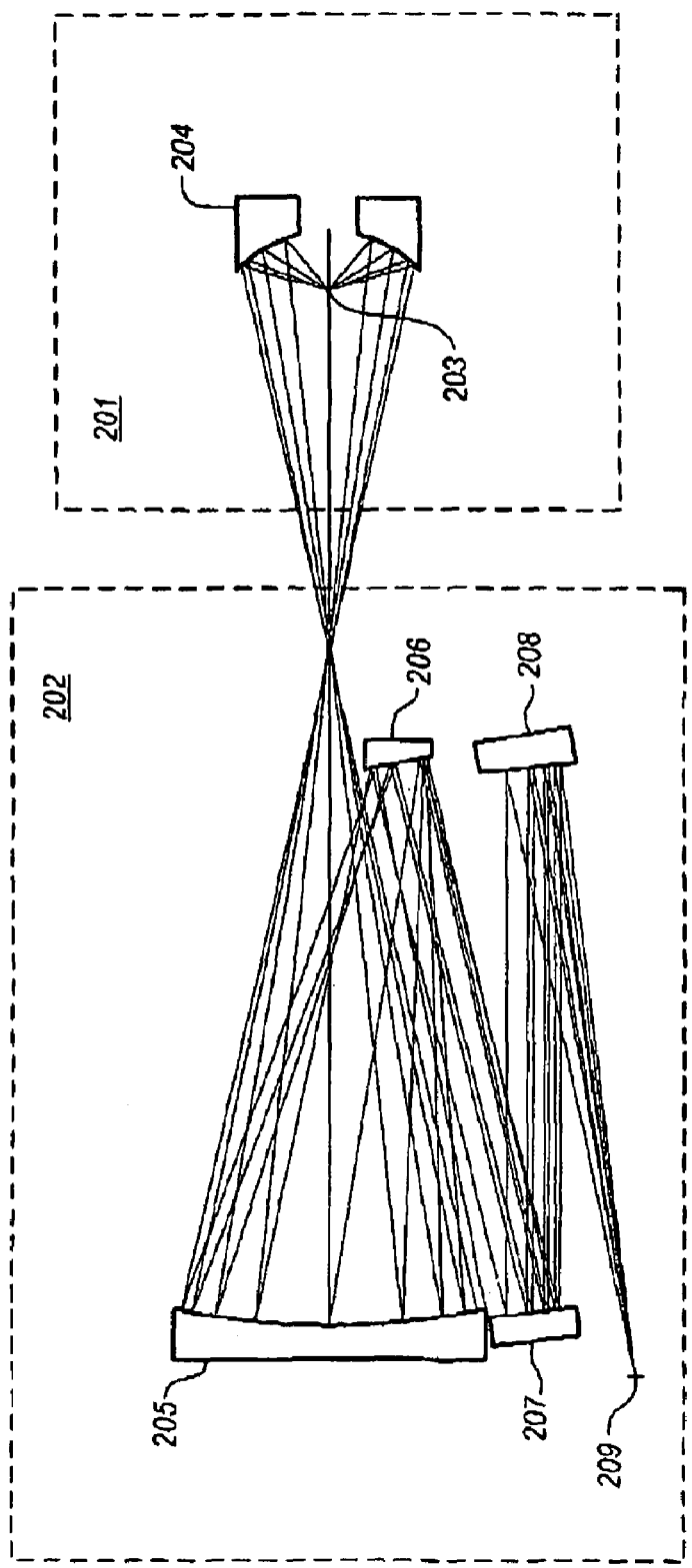
FIG. 2 (prior art) shows a condenser that processes light for entry to a projection camera.

FIG. 10 can be compared directly with FIG. 2. Recall that FIG. 2 shows a condenser system taught by Koch. Although Koch discloses that the collector mirror 204 can be faceted, Koch does not teach that the use of the faceted collector mirror can result in the elimination of optical components within the illumination system. Comparing FIGS. 2 and 10, note that faceted mirror 206 has effectively been eliminated from the illumination system in the condenser design of FIG. 10. That is, condenser 1001 is similar to the condenser design shown in FIG. 4a of the present application and the illumination system 1002 includes a faceted mirror 1005 and relaying mirrors 1007, 1008.

Recall that the original purpose of the illumination system is to effectively break down the light from the collector into a plurality of beams in order to form light of the proper shape and uniformity at the mask plane and also to properly fill the entrance pupil of the projection camera. With one or more of the mirrors 1010, 1011, 1012 in the collector 1001 being faceted, the illumination system 1002 receives light from the collector 1001 already broken down into a plurality of beams.

As such, one of the faceted mirrors in the illumination system (notably mirror 206) can be eliminated. The elimination of the reflecting mirror improves the collection efficiency of the condenser as a whole because the light will experience one less reflection and reflections are less than 100% efficient (i.e., a reflection involves some light loss, so with each reflection along the optical channel the amount of light that is lost through the channel increases).

Referring back to FIG. 3, if mirrors 301 and/or 302 are faceted, they assist in the breaking down the light from the source 305 into a plurality of beams. However, because light that impinges upon mirror 301 directly from the source will experience one more reflection than the light that impinges upon mirror 302 directly from the source, there can be an opposite image magnification imposed as between the light that reflects off of mirror 302 directly from the source 305 and the light that reflects off of mirror 302 from mirror 301.

As a consequence it is possible to stabilize (in terms of position) the source image 311 created by the collector. That is, because of the opposite magnification (e.g., "positive" and "negative") from the different beams of light, should the source 305 "move", the beams that are magnified positively will move in one direction while beams that are magnified negatively will move in the opposite direction. As such, the position of the source image 311 should remain somewhat fixed as a consequence of the built-in compensation. Similar compensation techniques can be achieved with discharge source collectors having one or more faceted mirrors.

For any of the mirrors described above, the materials that could be used to form their respective reflective surfaces may include: Gold, Aluminum, Platinum, Chromium, Nickel, Molybdenum, Silicon, Beryllium, Palladium, Tungsten, Ruthenium, Rhodium, Lithium.

Figure 11:
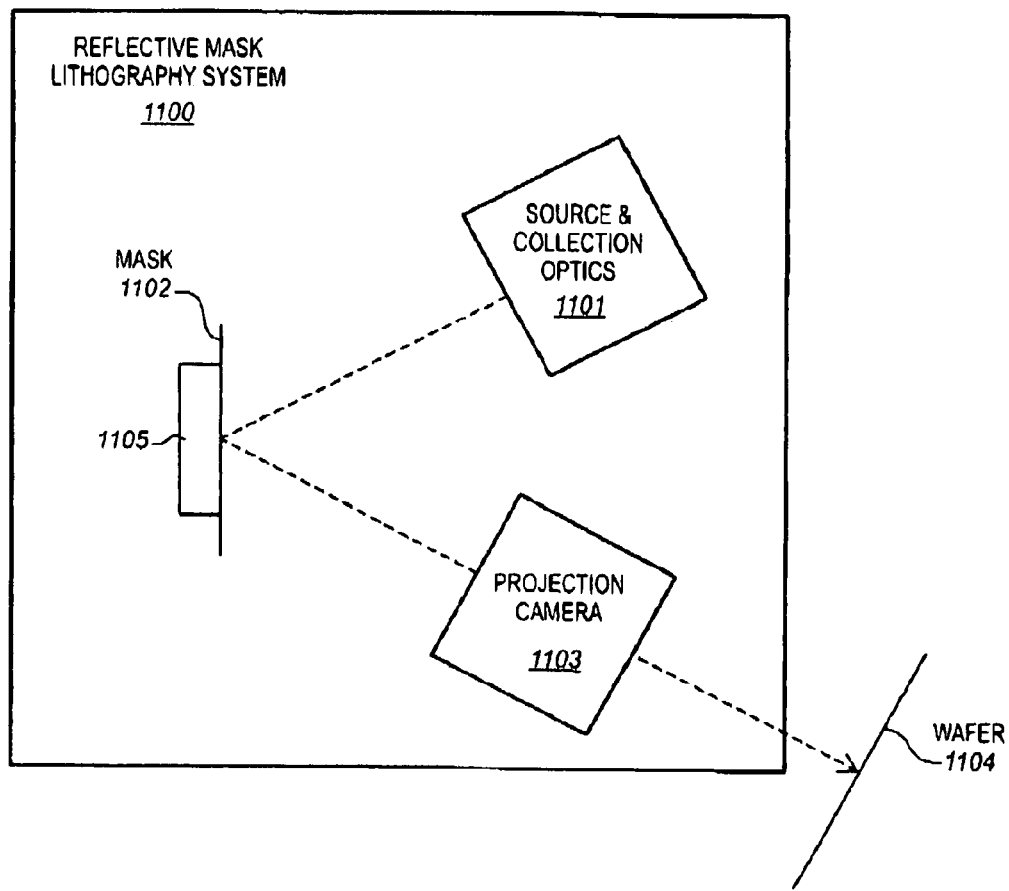
FIG. 11 shows a reflective mask lithography system.

A reflective mask lithography system 1100 is shown in FIG. 11. According to the design of the reflective mask lithography system of FIG. 11, a source and collection optics (such as any of those described above) 1101 directs light to a reflective mask 1102 that is held in place by some type of mechanical fixture 1105. Reflected light from the mask is directed into a projection camera 1103 that projects the reflected light onto a wafer 1104 that is being processed. The wafer 1104 is typically coated with some kind of photo resist. Depending on the type of photo resist (i.e., positive or negative), the light that is projected onto the photo resist will either be hardened or weakened so that specific features may be formed on the wafer.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A collector comprising:
    a discharge extreme ultra violet (EUV) light source that is not a laser produced plasma EUV light source;
    an optical path from said source to a mirror, said mirror being a first mirror that light emitted from said source and traveling along said optical path impinges upon, said first mirror positioned to receive the light emitted from said source at a normal or nearly normal angle of incidence,
    wherein said optical path further comprises a second mirror to reflect light reflected from said first mirror toward an illumination system, said illumination system to form a light beam from a plurality of light beams, and
    wherein light reflected from said first mirror and said second mirror is reflected from said second mirror at a normal or nearly normal angle of incidence, and
    wherein the first mirror and the second mirror do not surround or approximately surround the discharge EUV light source.

2. The collector of claim 1, wherein said illumination system is positioned to emit said light beam into a projection camera.

3. The collector of claim 2, wherein said first mirror is faceted, and wherein said illumination system comprises only one mirror.

4. The collector of claim 3, wherein said only one mirror is faceted.

5. The collector of claim 1, wherein said second mirror is positioned relative to said source and said first mirror such that light reflected from said first mirror and received by said second mirror passes by said source.

6. The collector of claim 5, wherein said second mirror is larger than said first mirror.

7. The collector of claim 5, wherein said first mirror is larger than said second mirror.

8. The collector of claim 5, wherein neither said first mirror nor said second mirror are annular.

9. The collector of claim 5, wherein said first mirror has a collection angle over a range within +75° to −75° inclusive.

10. The collector of claim 2, wherein said nearly normal angle of incidence at which the light is received from the source by the first mirror further comprises a range greater than 0° and less than or equal to 15° when measured against a ray that is perpendicular to said first mirror's reflective surface.

11. The collector of claim 10, wherein said illumination system is positioned to emit said light beam into a projection camera.

12. The collector of claim 11, wherein said illumination system comprises only one mirror.

13. The collector of claim 12, wherein said only one mirror is faceted.

14. The collector of claim 13, wherein said nearly normal angle of incidence of said light reflected from said first mirror and said second mirror comprises a range greater than 0° and less than or equal to 15° when measured against a ray that is perpendicular to said second mirror's reflective surface.

15. The collector of claim 10, wherein said second mirror is positioned relative to said source and said first mirror such that light reflected from said first mirror and received by said second mirror passes by said source.

16. The collector of claim 1, wherein said collector forms a plurality of beams with one or more of said mirrors being faceted so as to form opposite versions of said source image, said opposite versions positioned to compensate for any movement of said source.

17. The collector of claim 1, wherein the second mirror is convex.

* * * * *

UNITED STATES PATENT AND TRADEMARK OFFICE
CERTIFICATE OF CORRECTION

PATENT NO.         : 7,405,871 B2
APPLICATION NO. : 11/054040
DATED              : July 29, 2008
INVENTOR(S)        : Sasian It is certified that error appears in the above-identified patent and that said Letters Patent is hereby corrected as shown below:

In column 5, at line 46, delete "150" and insert --15°--.

Signed and Sealed this

Ninth Day of December, 2008

JON W. DUDAS
*Director of the United States Patent and Trademark Office*